US 6,653,857 B2

(12) United States Patent
Bobba et al.

(10) Patent No.: US 6,653,857 B2
(45) Date of Patent: Nov. 25, 2003

(54) INCREASING IMPLICIT DECOUPLING CAPACITANCE USING ASYMMETRIC SHIELDINGS

(75) Inventors: Sudhakar Bobba, Sunnyvale, CA (US); Tyler Thorp, Sunnyvale, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

(21) Appl. No.: 10/000,676

(22) Filed: Oct. 31, 2001

(65) Prior Publication Data

US 2003/0080773 A1 May 1, 2003

(51) Int. Cl.[7] ............................................. H03K 17/16
(52) U.S. Cl. ....................... 326/21; 326/101; 326/15; 327/403
(58) Field of Search ............................. 326/15, 21, 86, 326/90, 101; 327/379, 382, 403

(56) References Cited

U.S. PATENT DOCUMENTS

| | | | | |
|---|---|---|---|---|
| 5,436,573 A | * | 7/1995 | Ogawa et al. | 326/17 |
| 6,184,702 B1 | * | 2/2001 | Takahashi et al. | 326/21 |
| 6,285,208 B1 | * | 9/2001 | Ohkubo | 326/15 |

* cited by examiner

Primary Examiner—Daniel Chang
(74) Attorney, Agent, or Firm—Rosenthal & Osha L.L.P.

(57) ABSTRACT

An integrated circuit that asymmetrically shields a signal to increase decoupling capacitance is provided. The signal is asymmetrically shielded based on a probability of the signal being at a specific value. Further, a computer system that uses asymmetrically shielding to increase performance is provided. Further, a method for increasing an amount of implicit decoupling capacitance on a circuit through asymmetric shielding is provided. Further, a method to increase component performance by increasing implicit decoupling capacitance is provided.

16 Claims, 3 Drawing Sheets

INCREASING IMPLICIT DECOUPLING CAPACITANCE USING ASYMMETRIC SHIELDINGS

BACKGROUND OF INVENTION

A typical computer system has at least a microprocessor and memory. The microprocessor processes, i.e., executes, instructions to accomplish various tasks of the computer system. Such instructions, along with the data required by the microprocessor when executing these instructions, are stored in some form of memory. FIG. 1 shows a typical computer system having a microprocessor 10 and some form of memory 12. The microprocessor 10 has, among other components, a central processing unit (also known and referred to as "CPU" or "execution unit") 14 and a memory controller (also known as "load/store unit") 16. The CPU 14 is where the actual arithmetic and logical operations of the computer system take place. To facilitate the execution of operations by the CPU 14, the memory controller 16 provides the CPU 14 with necessary instructions and data from the memory 12. The memory controller 16 also stores information generated by the CPU 14 into the memory 12.

The operations that occur in a computer system, such as the logical operations in the CPU and the transfer of data between the CPU and memory, require power. If the components responsible for carrying out specific operations do not receive adequate power in a timely manner, computer system performance is susceptible to degradation. As an added challenge, power consumption of modem computers has increased as a consequence of increased operating frequencies. Thus, providing power to the components in a computer system in a sufficient and timely manner has become an issue of significant importance.

Often, power generated to a computer system component varies, which, in turn, affects the integrity of the component's output. Typically, this power variation results from the distance between a power supply for the component and the component itself. This distance may lead to the component not receiving power (via current) at the exact time it is required. One approach used by designers to combat this performance-inhibiting behavior is introducing decoupling capacitance (also referred to as "decap") to a particular circuit by positioning one or more decoupling capacitors close to the component. These decoupling capacitors store charge from the power supply and distribute the charge to the component when needed. For example, if power received by a component from a power supply attenuates, one or more decoupling capacitors will distribute charge to the component to ensure that the component is not affected by the power variation on the power supply. In essence, a decoupling capacitor acts as a local power supply for one or more specific components in a computer system.

Within a computer system component, such as a circuit, there are two types of decoupling capacitance: implicit and explicit. Explicit decoupling capacitance is provided to the circuit through the use of decoupling capacitors as discussed above. Implicit decoupling capacitance (also known in the art as "parasitic capacitance" and also referred to as "inherent capacitance") is capacitance that is inherent in a circuit. Implicit capacitance results from the electromagnetic effects between current-carrying wires. Further, implicit capacitance is a function of the distance between two such wires.

FIG. 2 shows the presence of explicit and implicit decoupling capacitance in a section of a typical computer system component 20. The component 20 has a power supply 22, where power from the power supply 22 is delivered to chip logic 24 via a power supply line 26 and a ground line 28. When there is power variation across the power supply 22, a decoupling capacitor 30 positioned in parallel with the power supply 22 provides charge, i.e., power, to the chip logic 24. In other words, the decoupling capacitor 30 provides explicit decoupling capacitance.

Still referring to FIG. 2, the existence of implicit decoupling capacitances 32, 34 is shown. A first occurrence of implicit decoupling capacitance 32 occurs between the power supply line 26 and a signal path 36 from the chip logic 24. A second occurrence of implicit decoupling capacitance 34 occurs between the signal path 36 and the ground line 28. The implicit decoupling capacitances 32, 34 are dependent on the characteristics of the signal path 36, specifically, whether a signal on the signal path 36 is high or low. When the signal is low, the implicit decoupling capacitance provided to the chip logic 24 is equal to the implicit decoupling capacitance 32 between the power supply line 26 and the signal path 36. Alternatively, when the signal is high, the implicit decoupling capacitance provided to the chip logic 24 is equal to the implicit decoupling capacitance 34 between the signal path 36 and the ground line 28.

In FIG. 2, the first and second occurrences of implicit decoupling capacitance 32, 34 are equal because the distance (shown in FIG. 2 as "D") between the power supply line 26 and signal path 36 and the distance between the signal path 36 and the ground line 28 are equal. Because the signal path 36 is equidistant from the power supply line 26 and the ground line 28, the signal path 36 is said to be "symmetrically shielded," where shielding refers to the providing of capacitance to prevent electromagnetic interference from reaching a signal.

As discussed above with reference to FIG. 2, a signal on the signal path may be high or low, and depending on the value of that signal, the amount of implicit decoupling capacitance present can be determined. In other words, the amount of implicit decoupling capacitance present on a signal path is a function of whether a signal on the signal path is high or low. However, regardless of whether a signal has a tendency to have a particular value, the amount of implicit decoupling capacitance present will be equal to the amount of implicit decoupling capacitance that would be present if the signal had another value. For example, although an AND gate under normal conditions has a tendency to output low, the amount of implicit decoupling capacitance present will be the same for when the AND gate outputs low and when the AND gate outputs high.

SUMMARY OF INVENTION

According to one aspect of the present invention, a computer system comprises a first wire, a signal path, and at least one other wire, where the first wire is disposed at a first distance from the signal path, where the at least one wire is disposed at a second distance from the signal path, and where the first distance and the second distance are dependent on a probability of a value of a signal on the signal path being at a specific value.

According to another aspect, an integrated circuit comprises a first node, a signal, and at least one other node, where the first node is positioned at a first distance from the signal, where the at least one node is positioned at a second distance from the signal, and where the signal is asymmetrically shielded by the first node and the at least one other node.

According to another aspect, a method for increasing decoupling capacitance in an integrated circuit comprises disposing a first wire at a first distance from a signal, disposing a second wire at a second distance from a signal, and asymmetrically shielding the signal by the first wire and the second wire, where the first distance and second distance are determined by a probability of the signal being at a specific value.

According to another aspect, a method for asymmetrically shielding a signal comprises determining a first probability of a signal being at a first value, determining a second probability of the signal being at a second value, positioning a first wire at a first distance from the signal, and positioning a second wire at a second distance from the signal, where the first distance is dependent on the first probability and the second distance is dependent on the second probability.

Other aspects and advantages of the invention will be apparent from the following description and the appended claims.

DETAILED DESCRIPTION

Embodiments of the present invention relate to a circuit that uses asymmetric shielding to increase implicit decoupling capacitance. Embodiments of the present invention further relate to a method for increasing implicit decoupling capacitance. Embodiments of the present invention further relate to a means for increasing implicit decoupling capacitance. Embodiments of the present invention further relate to a computer system that asymmetrically shields a wire to increase system performance.

The present invention takes into account the probability of a signal having a specific value. By knowing the probability, a signal path for the signal is positioned so as to shield the signal path to increase the implicit decoupling capacitance on that signal path.

Figure 1:
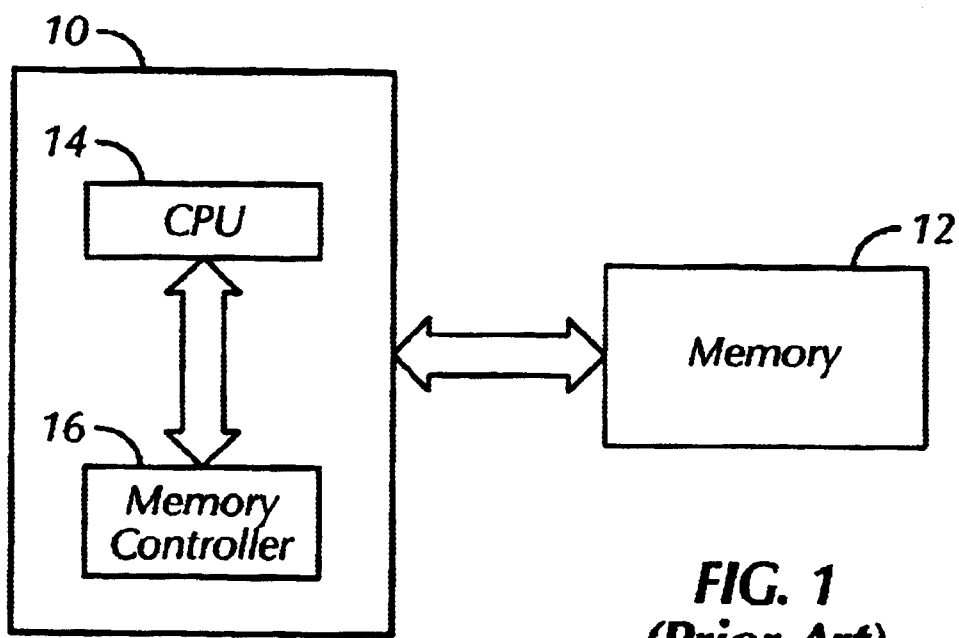
FIG. 1 shows a typical computer system.
Figure 2:
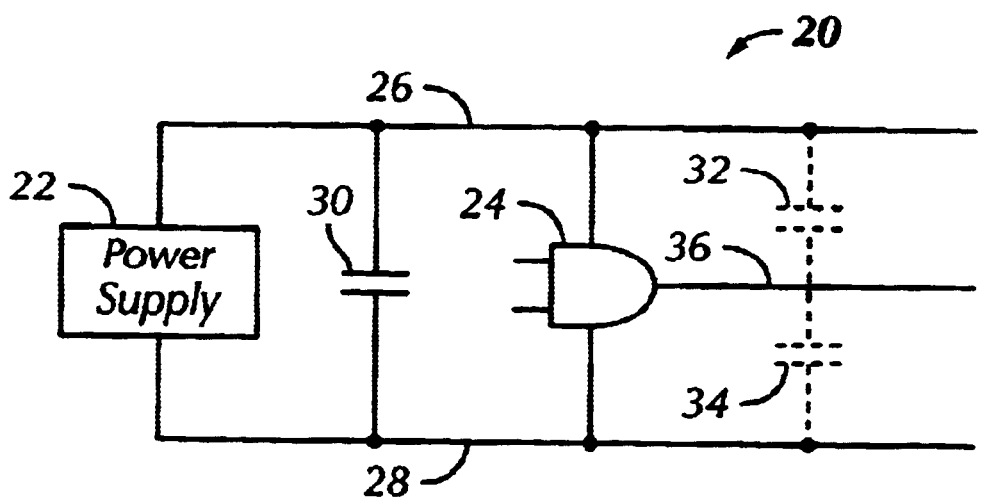
FIG. 2 shows a section of a typical computer system component.
Figure 3:
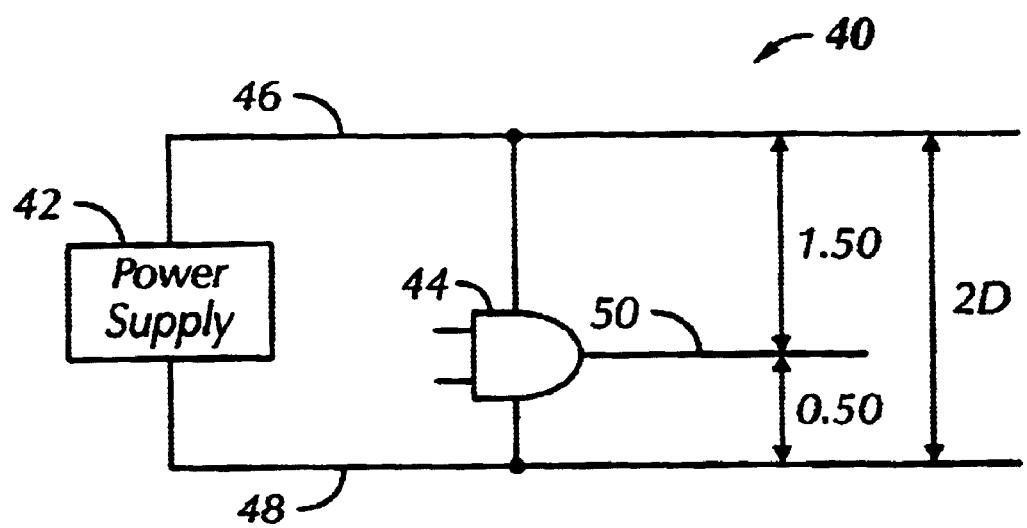
FIG. 3 shows a circuit in accordance with an embodiment of the present invention.

FIG. 3 shows an exemplary circuit 40 in accordance with an embodiment of the present invention. The circuit 40 has a power supply 42, which provides power to a two-input AND gate 44 via a power supply line 46 and a ground line 48. In turn, the two-input AND gate 44 outputs a signal on a signal path 50. The implicit decoupling capacitance on the signal path 50 is equal to $$P_L * Decap_L + P_H * Decap_H, \quad (1)$$

where $P_L$ is equal to the probability that the signal is low, $Decap_L$ is equal to the implicit decoupling capacitance when the signal is low, $P_H$ is equal to the probability that the signal is high, and $Decap_H$ is equal to the implicit decoupling capacitance when the signal is high. From Equation 1, it is apparent that in order to increase the amount of implicit decoupling capacitance on a wire, more decoupling capacitance should correspond to the higher probability.

Of the four possible input combinations to the AND gate 44, only one combination results in the AND gate 44 outputting high. The other three input combinations result in the AND gate 44 outputting low. Thus, the probability that a signal outputted from the AND gate 44 will be high is 0.25 and the probability that a signal outputted from the AND gate 44 will be low is 0.75. Accordingly, the signal from the AND gate 44 is said to be "predominantly low."

In order to maximize the amount of implicit decoupling capacitance on the signal path 50 according to Equation 1, the signal path 50 is shielded such that the distance between the signal path 50 and the ground line 48 is less than the distance between the signal path 50 and the power supply line 46. Particularly, because there is a three times more likely chance the signal on the signal path 50 will be low, the distance between the signal path 50 and the ground line 48 is three times shorter than the distance between the signal path 50 and the power supply line 46. As shown in FIG. 3, the distance between the signal path 50 and the ground line 48 is represented as 0.5D and the distance between the signal path 50 and the power supply line 46 is 1.5D, where D represents half the distance between the power supply line 46 and the ground line 48. Those skilled in the art will appreciate that shielding the signal path 50 in this manner increases the implicit decoupling capacitance associated with the signal path 50 because decoupling capacitance is a direct function of distance.

If, for example, the total implicit decoupling capacitance between the power supply line 46 and the ground line 48 is 20 F, the shielding of the signal path 50 in the manner described above results in 15 F of decoupling capacitance between the signal path 50 and the ground line 48 and 5 F of decoupling capacitance between the signal path 50 and the power supply line 46. Thus, considering the probabilities of the signal on the signal path 50 being high and low, Equation (1) yields an implicit decoupling capacitance amount equal to 0.75*15 F+0.25*5 F, or 12.5 F. Those skilled in the art will appreciate that this amount of implicit decoupling capacitance is greater than the amount of implicit decoupling capacitance that would be present if the signal path 50 was symmetrically shielded, in which case, the implicit decoupling capacitance would be equal to 10 F during operation of the circuit 40.

Figure 4:
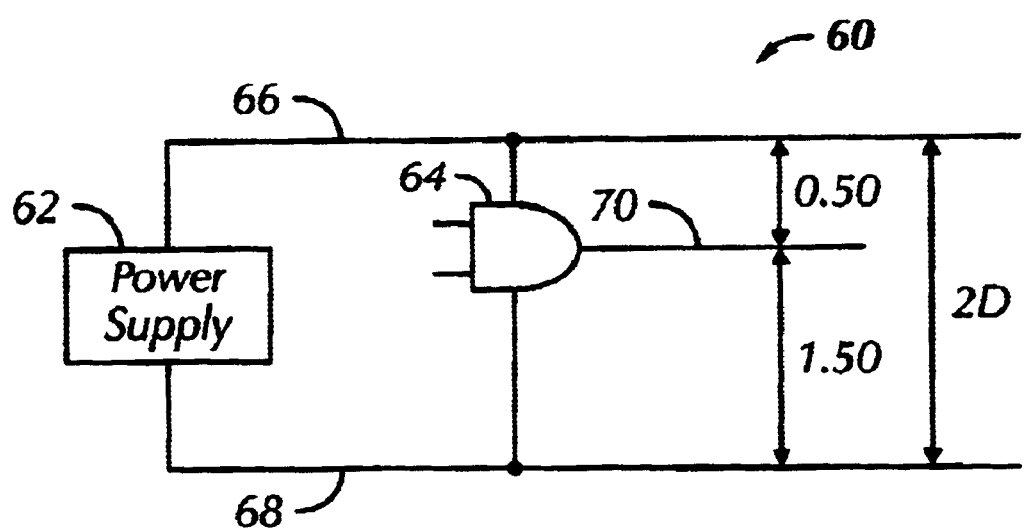
FIG. 4 shows a circuit in accordance with another embodiment of the present invention.

FIG. 4 shows an exemplary circuit 60 in accordance with another embodiment of the present invention. The circuit 60 has a power supply 62, which provides power to a two-input OR gate 64 via a power supply line 66 and a ground line 68. In turn, the OR gate 64 outputs a signal on a signal path 70.

Of the four possible input combinations to the OR gate 64, only one combination results in the OR gate 64 outputting low. The other three input combinations result in the OR gate 64 outputting high. Thus, the probability that a signal outputted from the OR gate 64 will be high is 0.75 and the probability that a signal outputted from the OR gate 64 will be low is 0.25. Accordingly, the signal from the OR gate 64 said to be "predominantly high."

In order to maximize the amount of implicit decoupling capacitance on the signal path 70 according to Equation 1, the signal path 70 is shielded such that the distance between the signal path 70 and the power supply line 66 is less than the distance between the signal path 70 and the ground line 68. Particularly, because there is a three times more likely chance the signal on the signal path 70 will be high, the distance between the signal path 70 and the power supply line 66 is three times shorter than the distance between the signal path 70 and the ground line 68. As shown in FIG. 4, distance between the signal path 70 and the power supply line 66 is represented as 0.5D and the distance between the signal path 70 and the ground line 68 is 1.5D, where D represents half the distance between the power supply line 66 and the ground line 68. Those skilled in the art will appreciate that shielding the signal path 70 in this manner increases the implicit decoupling capacitance associated with the signal path 70 because decoupling capacitance is a direct function of distance.

Those skilled in the art will appreciate that although the embodiments shown in FIGS. 3 and 4 use two-input logic gates, circuit logic having any number of inputs may be used. All that is required is that one be able to ascertain the probability of a value on an output signal from particular circuit logic. Further, those skilled in the art will appreciate that a signal may be shielded by nodes, where the distance between the signal and the individual nodes depends on the probability of the signal being at a specific value. Further, those skilled in the art will appreciate that the embodiments shown in FIGS. 3 and 4 may reside in an integrated circuit or other electrical component.

Figure 5:
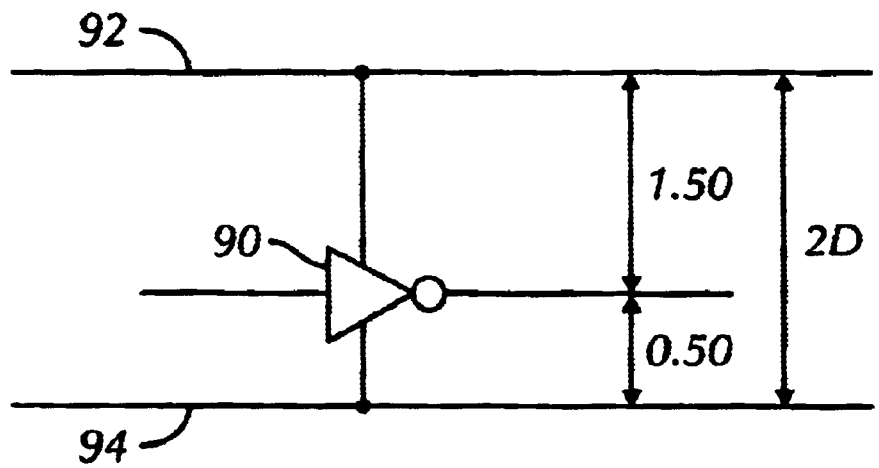
FIG. 5 shows a circuit in accordance with another embodiment of the present invention.

The use of asymmetric shielding to increase implicit decoupling capacitance may be also be used for logic that has a high and low output probability of 0.5, i.e., logic that is neither "predominantly high" nor "predominantly low." FIG. 5 shows an asymmetrically shielded inverter (90) in accordance with an embodiment of the present invention. The inverter (90), as most typical inverters, has a high and low output probability of 0.5. However, unlike the use of inverters in the prior art, the present invention applies asymmetrical shielding to the inverter 90 in order to increase implicit decoupling capacitance. As shown in FIG. 5, the inverter 90 is positioned 1.5D from a power supply line 92 and 0.5D from a ground line 94, where D represents half the distance between the power supply line 92 and the ground line 94. Because capacitance is an inverse function of distance, i.e., $C=1/D$, the arrangement of the inverter 90 shown in FIG. 5 leads to an implicit decoupling capacitance of $0.5*(1/1.5)$ F$+0.5*(1/0.5)$ F, or 1.33 F. This amount of implicit decoupling capacitance is greater than the amount of implicit decoupling capacitance that would have been present had the inverter been symmetrically shielded because if the inverter is symmetrically shielded, then the amount of implicit decoupling capacitance is equal to $0.5*(1/1)$ F$+0.5*(1/1)$ F, or 1 F. Thus, those skilled in the art will appreciate that even logic gates that have equal high and low output probabilities may benefit from the present invention's use of asymmetrical shielding.

Figure 6:
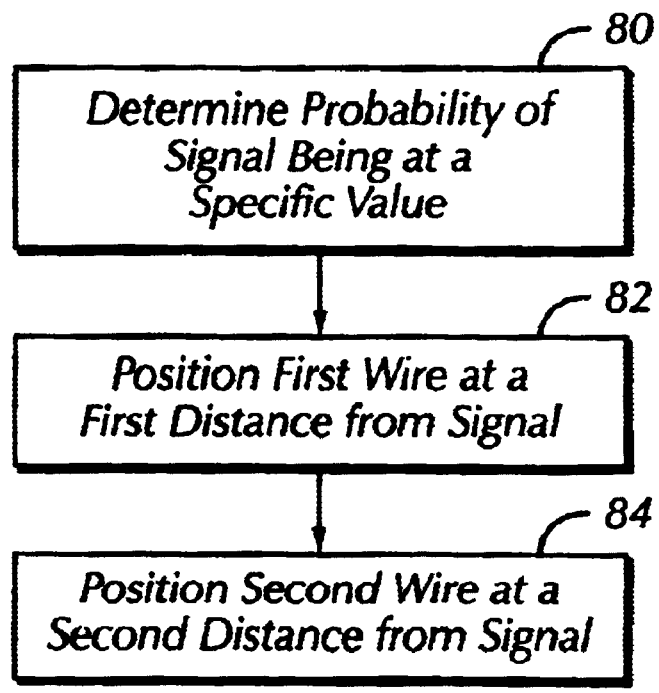
FIG. 6 shows a flow process in accordance with an embodiment of the present invention.

FIG. 6 shows an exemplary flow process in accordance with an embodiment of the present invention. Initially, a probability of a signal being at a certain value is determined step 80. Thereafter, a first wire or node is positioned at a first distance from the signal, where the first distance corresponds to the probability determined in the previous step step 82. Then, a second wire or node is positioned at a second distance from the signal, where the second distance corresponds to the probability determined in the first step step 84. Generally, the first and second distances correspond with the probability in that the lower the probability of the signal being at a value close to a wire, the further the wire is positioned from the signal relative to the position of the signal to the other wire. Those skilled in the art will appreciate that following the flow process described above leads to asymmetrical shielding of the signal. Further, those skilled in the art will appreciate that the asymmetrical shielding effect of the flow process shown in FIG. 5 may be achieved an other order of steps not shown in FIG. 5. For example, instead of the positioning the first and second wires in reference to the signal, the signal may be positioned with reference to the first and second wires.

Advantages of the present invention may include one or more of the following. In some embodiments, because a signal is asymmetrically shielded, a circuit may have more decoupling capacitance than when the signal is symmetrically shielded.

In some embodiments, because a signal asymmetrically shielded, increased decoupling capacitance is provided to one or more components in a computer system, effectively leading to better system performance.

In some embodiments, because implicit decoupling capacitance is increased through asymmetrical shielding, fewer decoupling capacitors are needed, and thus, more components may be positioned on an integrated circuit.

In some embodiments, because implicit decoupling capacitance is higher, a smaller integrated circuit die may be used.

While the present invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer system, comprising:
   a first wire of the computer system;
   a signal path of the computer system, wherein the first wire is disposed at a first distance from the signal path; and
   at least one other wire of the computer system, wherein the at least one wire is disposed at second distance from the signal path;
   wherein the first distance and the second distance are dependent on a probability of a value of a signal on the signal path being at a specific value.

2. The computer system of claim 1, wherein the first distance is less than the second distance when the probability of the value of the signal being at a value closer to the first wire is greater than the probability of the value of the signal being at a value closer to the second wire.

3. The computer system of claim 1, wherein the second distance is less than the first distance when the probability of the value of the signal being at a value closer to the second wire is greater than the probability of the value of the signal being at a value closer to the first wire.

4. The computer system of claim 1, wherein the first wire and the second wire are operatively connected to a power supply.

5. The computer system of claim 1, wherein the signal path is operatively connected to chip logic.

6. An integrated circuit, comprising:
   a first node;
   a signal, wherein the first node is positioned at a first distance from the signal; and
   at least one other node, wherein the at least one node is positioned at a second distance from the signal;
   wherein the signal is asymmetrically shielded by the first node and the at least one other node according to the first distance and the second distance dependent on a probability of a value of the signal being at a specific value.

7. The integrated circuit of claim 6, wherein the first distance is determined by a probability of the signal being at a value of the first node.

8. The integrated circuit of claim 6, wherein the second distance is determined by a probability of the signal being at a value of the second node.

9. The integrated circuit of claim 6, wherein the first node and second node are operatively connected to a power supply.

10. The integrated circuit of claim 6, wherein the signal is an output from a logic component on the integrated circuit.

11. A method for increasing decoupling capacitance in an integrated circuit, comprising:

disposing a first wire at a first distance from a signal;

disposing a second wire at a second distance from a signal; and asymmetrically shielding the signal by the first wire and the second wire, wherein the first distance and second distance are determined by a probability of the signal being at a specific value.

12. The method of claim 11, wherein the first distance is less than the second distance when the probability of the signal being at a value closer to the first wire is greater than the probability of the signal being at a value closer to the second wire.

13. The method of claim 11, wherein the second distance is less than the first distance when the probability of the signal being at a value closer to the second wire is greater than the probability of the value of the signal being at a value closer to the first wire.

14. The method of claim 11, wherein the first wire and the second wire are operatively connected to a power supply.

15. The method of claim 11, wherein the signal is operatively connected to a logic component.

16. A method for asymmetrically shielding a signal, comprising:

determining a first probability of a signal being at a first value;

determining a second probability of the signal being at a second value;

positioning a first wire at a first distance from the signal; and positioning a second wire at a second distance from the signal;

wherein the first distance is dependent on the first probability and the second distance is dependent on the second probability.

* * * * *

UNITED STATES PATENT AND TRADEMARK OFFICE
CERTIFICATE OF CORRECTION

PATENT NO.    : 6,653,857 B2
DATED         : November 25, 2003
INVENTOR(S)   : Sudhakar Bobba et al.

It is certified that error appears in the above-identified patent and that said Letters Patent is hereby corrected as shown below:

<u>Column 6,</u>
Line 31, please add -- a -- after the second occurrence of "at".

Signed and Sealed this

Twenty-fourth Day of February, 2004

JON W. DUDAS
*Acting Director of the United States Patent and Trademark Office*